United States Patent [19]

Wilson et al.

[11] Patent Number: 4,985,195
[45] Date of Patent: Jan. 15, 1991

[54] METHOD OF FORMING A MOLECULARLY POLARIZED POLMERIC SHEET INTO A NON-PLANAR SHAPE

[75] Inventors: David T. Wilson, Billerica; Neil T. Dionesotes, Acton; Paul F. Roman, Dorchester, all of Mass.

[73] Assignee: Raytheon Company, Lexington, Mass.

[21] Appl. No.: 286,901

[22] Filed: Dec. 20, 1988

[51] Int. Cl.⁵ .............................................. B29C 51/00
[52] U.S. Cl. ...................................... 264/320; 264/22
[58] Field of Search ................................. 264/22, 320

[56] References Cited

U.S. PATENT DOCUMENTS

| | | | |
|---|---|---|---|
| 4,384,394 | 5/1983 | Lemonon et al. | 264/22 |
| 4,403,382 | 9/1983 | Facoetti et al. | 264/22 |
| 4,508,668 | 4/1985 | Bronssoux et al. | 264/320 |

Primary Examiner—James Lowe
Attorney, Agent, or Firm—Denis G. Maloney; Richard M. Sharkansky

[57] ABSTRACT

A method for forming sheets of polarized PVDF into non-planar shaped bodies is described. The technique includes the steps of shaping the polymer material by disposing a sheet of the polymer material about a non-planar surface and subjecting the sheet of polymer material and said non-planar surface to an elevated temperature for a predetermined period of time until said non-planar shape is permanently imparted to the sheet of molecularly polarized polyvinylidenefluoride material.

13 Claims, 2 Drawing Sheets

METHOD OF FORMING A MOLECULARLY POLARIZED POLMERIC SHEET INTO A NON-PLANAR SHAPE

BACKGROUND OF THE INVENTION

This invention relates generally to molecularly polarized polymer materials and in particular to techniques for forming molecularly polarized polymer materials into non-planar shapes.

As is known in the art, certain polymer and co-polymer materials may be provided with piezoelectric properties. For example, sheets of a polymer material comprising polyvinylidenefluoride having long repeating chains of $CH_2$—$CHF_2$ molecules can have these chains orientated to provide a net polarization. Such material when provided with conductive electrodes over opposing surfaces thereof have piezoelectric properties which make them suitable for transducers. Such transducers have important applications in the generation and reception of acoustic energy.

In certain applications for such transducers such as in towed sonar arrays, the generally used flat sheets of PVDF are not the optimum shape. It would be desireable to have such sheets of PVDF preformed into some specific shape, such as a dome, a hemi-cylindrical section, or a rod.

One technique suggested in the art for providing non-planar shaped layers of molecularly polarized polymers includes the use of plastic extrusion techniques. That is, a coat of polymer material may be deposited over a wire by extruding the polymer material onto a member which is drawn through or passed by the extruder. A second technique is a cold forming technique in which a sheet of molecularly polarized polymer material is bent into a desired position and clamped or otherwise held into position forming a non-planar shape.

Nevertheless, it would be desireable to provide various non-planar shapes of polyvinylidenefluoride materials. In particular, it would be desireable to provide a technique for forming such shapes after the polyvinylidenefluoride has been polarized. Moreover, it would be desireable to provide permanent shapes of such material to eliminate the need for extensive clamping, for example, as required in the cold-forming technique and, furthermore, to provide a variety of shapes rather than those limited by the extrusion process.

SUMMARY OF THE INVENTION

In accordance with the present invention, a method of forming a sheet of molecularly polarized polymer material into a non-planar shape after said material has been molecularly polarized is provided by disposing said molecularly polarized sheet of polymer material about a mold selected to impart a desired non-planar shape to said sheet. The sheet and mold are heated to an elevated temperature above the thermal setting temperature of the material but just below the piezoelectric transition temperature of the particular material for a predetermined period of time. With this particular arrangement, a non-planar shape of molecularly polarized polymer material is provided through use of a heating type step. A replicated surface of the desireable non-planar shape is permanently provided to the sheet. Non-planar shapes such as cylinders, hemi-cylinders, domes, and spirals, thus may be provided with this technique by appropriate choice of the mold shape. Once the material has been shaped into the non-planar shape, it has been found that the shape is permanently retained without any significant degradation in the piezoelectric properties of the material.

In accordance with a further aspect of the present invention, a method of forming a sheet of molecularly polarized polyvinylidenefluoride into a non-planar shape is provided by disposing the sheet of molecularly polarized polyvinylidenefluoride about a mandrel having a desired complimentary non-planar shape, securing said sheet to said mandrel, and subjecting the sheet and mandrel to an elevated temperature in a range above the thermal setting temperature of the polyvinylidenefluoride and below the piezoelectric transition temperature of the polyvinylidenefluoride for a predetermined period of time. With this particular arrangement, a permanently shaped body comprised of molecularly polarized polyvinylidenefluoride is provided. The non-planar shaped body retains the piezoelectric properties of the pre-formed material.

Electrode surfaces may then be provided over opposing surfaces of the non-planar body using conventional techniques to provide a transducer element having a desired non-planar shape for use in appropriate applications.

BRIEF DESCRIPTION OF THE DRAWINGS

The foregoing features of this invention, as well as the invention itself, may be more fully understood from the following detailed description of the drawings, in which.

DESCRIPTION OF THE PREFERRED EMBODIMENTS

Figure 1:
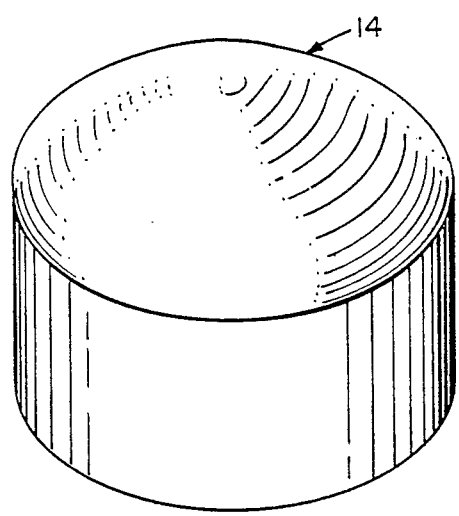
FIG. 1 is a plan view of a portion of a mold having a hemispherical surface.
Figure 2A:
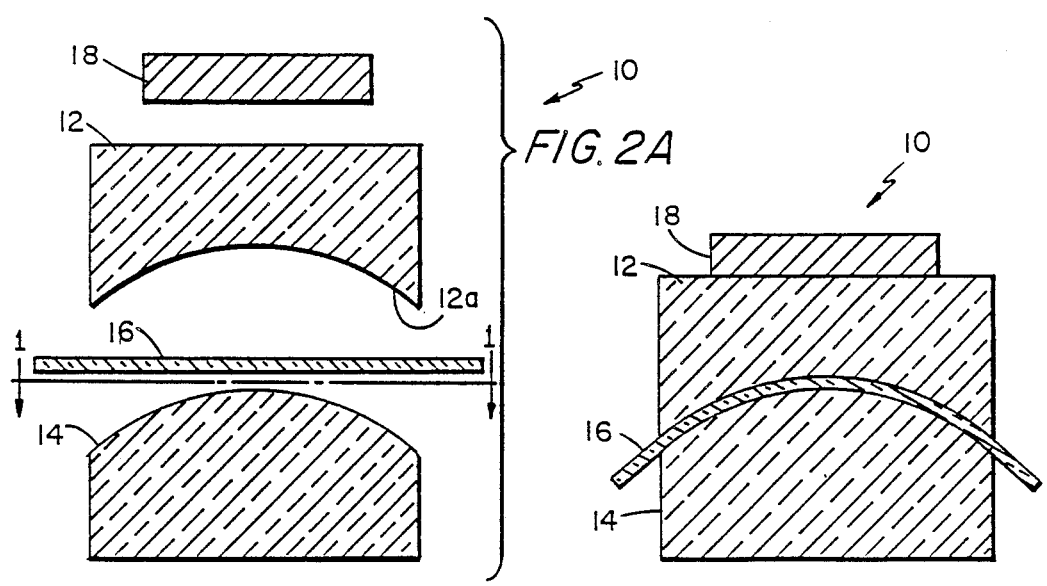
FIG. 2A is a composite cross-sectional view showing in cross section the hemispherical mold of FIG. 1 and a complimentary mold to provide a composite mold for forming the sheet into a non-planar shape in accordance with a first aspect of the present invention.
Figure 2B:
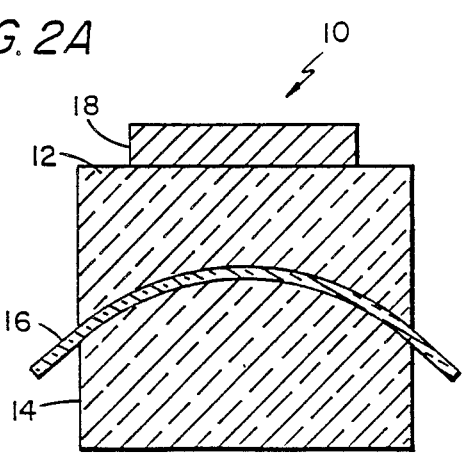
FIG. 2B is a cross-sectional view showing the molds of FIG. 2A disposed to form a sheet of polyvinylidenefluoride into a hemispherical member.

Referring now to FIGS. 1, 2A, and 2B, a mold 14 here having a hemi-spherical convex surface 14a and comprised of cast iron is shown having disposed thereover a sheet 16 of a molecularly polarized polymer material, preferably polyvinylidenefluoride or a copolymer thereof which has been stretched and poled to impart to the sheet 16 certain piezoelectric properties. The sheet 16 (shown in FIGS. 2A, 2B) is absent electrodes which are generally placed over opposing major surfaces of the sheet as is known. The preferred technique to provide the sheet of molecularly polarized polymer into a non-planar shape is to form the layer into the non-planar shape as will be discussed prior to placement of the electrodes. The electrodes make the sheet stiffer and thus more difficult to work with. However, if the electrodes are relatively thin, such that the stiffness of the sheet is not significantly increased, the non-planar shape can be imparted to the sheet after the electrodes have been applied.

An upper mold 12 having a hemispherical concave surface 12a is shown disposed over the second opposite surface of sheet 16. A weight 18 is then shown disposed over the upper mold 12.

As shown in FIG. 2B, a composite mold 10 is provided by bringing mold 12 into contact with sheet 16 in place over mold 14. Mold 12 is secured to mold 14 by use of a weight 18 or other suitable means. As mold 12 is brought into place with mold 14, sheet 16 of polyvinylidenefluoride is deformed from its substantially original, planar shape into the non-planar shape of here the dome, as generally shown in conjunction with FIG. 1. The mold assembly 10 is then placed within a furnace and is heated to a temperature in a range above the minimum thermal setting plastic temperature of the polyvinylidenefluoride and below the piezoelectric transition temperature of the PVDF (i.e. the temperature at which the polyvinylidenefluoride starts to lose its piezoelectric properties).

Figure 2C:
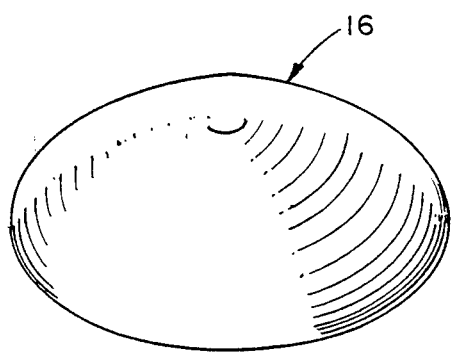
FIG. 2C is an isometric view of the dome formed in accordance with the steps shown in FIGS. 2A and 2B.

The mold assembly 10 is placed in the furnace for a predetermined period of time. After the mold assembly is removed from the furnace and is cooled, the weight 18 is removed, and the mold assembly sections 12 and 14 are also removed leaving the dome shape member 16' as shown in FIG. 2C.

Figure 2D:
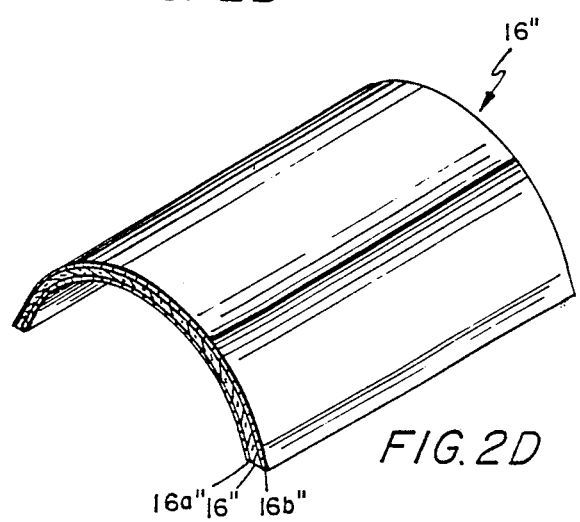
FIG. 2D is a hemi-cylindrical member formed in accordance with the steps generally described in conjunction with FIGS. 2A and 2B using a mold having a hemi-cylindrical shape.

If mold assembly sections 12 and 14 had the complimentary shapes of hemi-cylindrical members rather than domes as shown in FIG. 1, then the sheet as shown in FIG. 2D having a hemi-cylindrical shaped sheet 16'' would be formed.

At this point, as shown in FIG. 2D the hemi-cylinder's electrode surfaces 16a', 16b' are disposed over the inner and outer surfaces of the non-planar shaped polyvinylidenefluoride body. The electrode surfaces may be deposited by any means such as evaporation or sputtering and are generally provided to specify thicknesses of the order of at least about 25 microns up to and above 100 microns.

A preferred material as a source material for the polyvinylidenefluoride sheet 16 is polyvinylidenefluoride obtained from Raytheon Company Research Division, Lexington, Mass. This material has piezoelectric properties which are stable up to at least 90° C. and thus, the mold assembly 10 may be placed in an oven which is disposed at a temperature of 90° C. for here 6 hours to provide the non-planar shaped structure. Temperature generally in the range of about 60° C. to 100° C. may be used with this material. Most preferrable, the range is about 88° C. to 92° C. Other sources of material may alternatively be used. These sources of material in general have lower piezoelectric transition temperatures than the aforementioned material from Raytheon Research Division. Accordingly, the temperature at which the mold assembly is held is selected to be somewhat lower than that described for the Raytheon Research Division PVDF material. However, as long as the temperature is above the thermal setting temperature of the PVDF material, a desired shape will also be provided without any significant loss in the piezoelectric properties of the sheet 16. With lower temperature, longer periods of time may be required.

Figure 3:
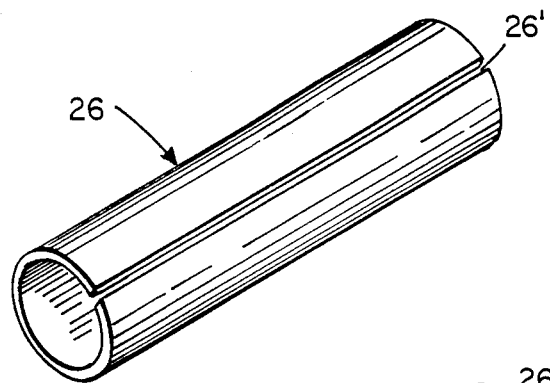
FIG. 3 is an isometric view of a cylinder of polyvinylidenefluoride.

Referring now to FIGS. 3-7, alternate shapes of polyvinylidenefluoride bodies comprised of polyvinylidenefluoride are shown. Referring momentarily to FIG. 3, a cylinder of polyvinylidenefluoride 26 is shown. The cylinder has a hollow interior and a voided longitudinal portion 26' which results from a sheet of such material being disposed or being permanently folded into the cylindrical shape. Two techniques for providing the cylinder 26 shown in FIG. 3 are here described.

Figure 4:
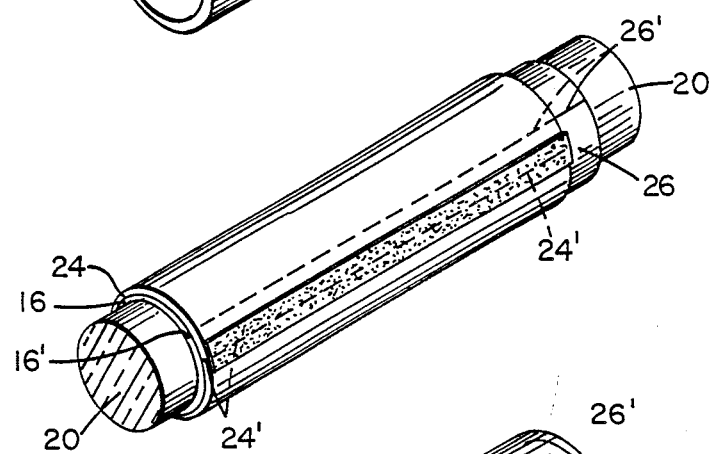
FIG. 4 is an isometric view of a cylindrical mandrel having wrapped thereabout a sheet of polyvinylidenefluoride which is formed into a cylindrical sheet.
Figure 5:
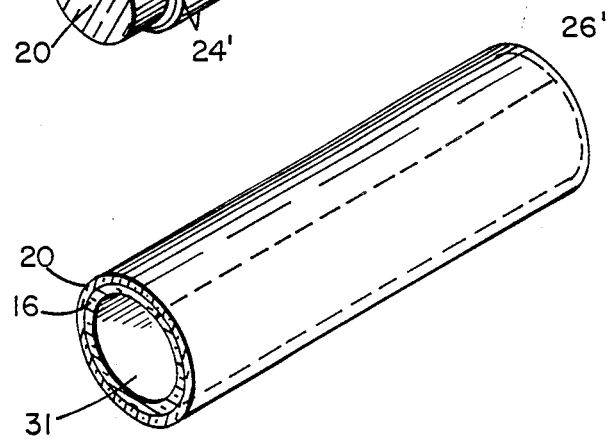
FIG. 5 is an isometric view showing an alternate technique for forming a cylinder of polyvinylidenefluoride.

Referring first to FIG. 4, a mandrel 20 here comprised of wood or a metal has disposed thereabout a sheet 26 of polyvinylidenefluoride. The sheet 26 of polyvinylidenefluoride (PVDF) is secured by a woven Teflon cloth 24 disposed about the sheet 26. Teflon cloth 24 and PVDF sheet 26 are secured in place by tape 28 or alternatively with clamps or other suitable means. Here the sheet 26 is disposed about mandrel 20 such that opposing edges of the sheet 26 are disposed together to form a joint 26' as shown. A joint 24' provided by the Teflon cloth 24 is also shown. This assembly is then placed within an oven and heated to the temperature in the range above the thermal setting temperature of the polyvinylidenefluoride but below the piezoelectric transition temperature of the polyvinylidenefluoride, as described above in conjunction with FIG. 2B. Again, this assembly is maintained for a predetermined period of time here 6 hours but generally in the range of 1 hours to 24 hours more preferrable in the range of 5 to 7 hours.

Alternatively, rather than wrapping a sheet of polyvinylidenefluoride about a mandrel 20, a hollow mandrel or hollow mold 30 which is here a cylinder having a hollow central portion 31 may alternatively be used. The sheet 16 is rolled up and disposed within the cylinder as shown. The sheet then releases and is secured in place by the inner walls of the mold 30. The sheet takes on the inner shape of the walls of mold 30. After release of the sheet, the joint 26' as described above is also provided. Again, in a similar manner, this assembly is placed in an oven and heated to a temperature in the range and for the period of time as described above in conjunction with FIG. 2B. From the techniques described in either FIG. 4 or FIG. 5, the cylindrically shaped layer of molecularly polarized polyvinylidenefluoride 26 as shown in FIG. 3 is provided.

Figure 6:
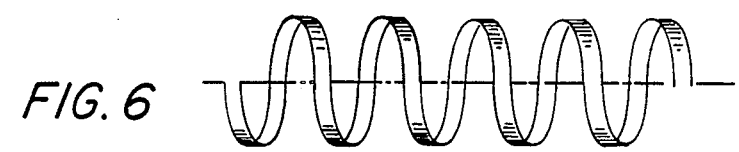
FIG. 6 is a perspective view of a mandrel having disposed thereabout a thin strip of polyvinylidenefluoride to be shaped into a helix.

Referring now to FIG. 6, a helix 36 comprised of molecularly polarized PVDF is shown. The helix is formed as will now be described in conjunction with FIG. 7.

Figure 7:
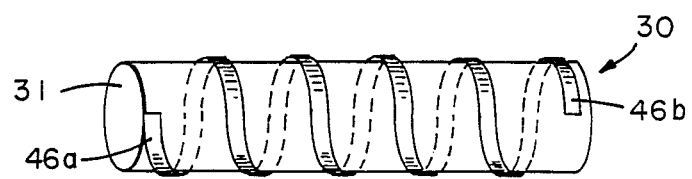
FIG. 7 is a helix of polyvinylidenefluoride formed in accordance with FIG. 6.

Referring now to FIG. 7, a strip of polyvinylidenefluoride 46 is disposed about a mandrel 30. Here the strip is disposed along a bias angle with respect to the mandrel such that a spiral of the polyvinylidenefluoride is disposed about the mandrel 30. Ends 46a and 46b of strip 46 are secured to the mandrel so that the strip 46 of polyvinylidenefluoride is secured in a spiral shape about the mandrel 30. Tape or other suitable fastening means may be used to secure ends 46a, 46b. The mandrel assembly 30 having the strip 46 is then disposed in an oven and heated to the temperature over the period of time as generally described in conjunction with FIG. 2B. After the strip 46 is removed from the mandrel 30, the strip 46 will be a helix or spiral 36, as shown in FIG. 6.

Having described preferred embodiments in the invention, it will now become apparent to one of the skill in the art that other embodiments incorporating their concepts may be used. It is felt, therefore, that these embodiments should not be limited to disclosed embodiments, but rather should be limited only to by the spirit and scope of the appended claims.

What is claimed is:

1. A method of forming a sheet of molecularly polarized polymer material into a non-planar shape after said material has been molecularly polarized, comprises the steps of:

disposing said sheet of polymer material about a mold having a selected non-planar shape selected to impart a desired non-planar shape to said sheet; and heating said sheet and mold to an elevated temperature above the thermal setting temperature of the material but below the piezoelectric transition temperature of the material for a predetermined period of time.

2. The method of claim 1 wherein said heating step occurs at a temperature of about 90° C. for about 6 hours.

3. The method of claim 1 wherein said mold includes a pair of members having mutually complimentary shaped surfaces and said disposing step comprises the step of pressing said sheet between the pair of non-planar mutually complimentary shaped members.

4. The method of claim 2 wherein during said pressing step the pair of non-planar mutually complimentary shaped members are a first member having a concave surface and a second member having a convex surface, and said concave surface and said convex surfaces are disposed over said sheet of material to impart to at least a portion of said sheet of material a hemispherical surface.

5. The method of claim 4 wherein said heating step occurs at an elevated temperature of 90° C. for about 6 hours.

6. The method of claim 1 wherein said mandrel is an elongated tubular member and wherein said disposing step comprises the step of winding said sheet about said elongated tubular member.

7. The method of claim 6 wherein said heating step occurs at an elevated temperature of 90° C. for about 6 hours.

8. The method of claim 1 wherein said disposing step comprises the step of inserting said sheet of material into a mold to let the sheet be confined by the interior of the mold.

9. The method of claim 8 wherein the mold is a hollow elongated member.

10. The method of claim 9 wherein the heating step occurs at a temperature of 90° C. for about 6 hours.

11. A method of forming a sheet of molecularly polarized polyvinylidenefluoride into a non-planar shape comprises the steps of:

disposing the sheet of polarized PVDF about a mandrel having a desired complimentary non-planar shape;

heating said polarized sheet disposed about the mandrel by subjecting the sheet and mandrel to an elevated temperature in the range of about 60° C. to 100° C. for a period of time of about 1 hour to 24 hours; and removing said sheet of polyvinylidenefluoride having imparted thereto the desired non-planar shape.

12. The method as recited in claim 11 wherein the heating step occurs at a temperature in the range of about 88° C. to 92° C. for a period of time about 5 hours to 7 hours.

13. The method as recited in claim 12 wherein after the removing step, the method includes the steps of providing electrode surfaces over opposing major surfaces of said nonplanar shaped body.

* * * * *